(12) United States Patent
Fukui et al.

(10) Patent No.: US 6,292,926 B1
(45) Date of Patent: Sep. 18, 2001

(54) FUNCTIONAL MODULE MODEL, PIPELINED CIRCUIT SYNTHESIS AND PIPELINED CIRCUIT DEVICE

(75) Inventors: Masahiro Fukui; Masakazu Tanaka; Toshiro Akino, all of Osaka; Masaharu Imai, Hyogo; Yoshinori Takeuchi, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/109,042

(22) Filed: Jul. 2, 1998

(30) Foreign Application Priority Data

Jul. 3, 1997 (JP) .................................................. 9-177951

(51) Int. Cl.⁷ .................................................. G06F 17/50
(52) U.S. Cl. ..................... 716/8; 716/2; 716/7; 716/11; 716/12; 716/6
(58) Field of Search ............................. 716/1, 19, 8–11, 716/12, 6, 2, 7; 717/5

(56) References Cited

U.S. PATENT DOCUMENTS

| | | | |
|---|---|---|---|
| 5,237,514 | * | 8/1993 | Curtin .................................. 716/10 |
| 5,383,145 | | 1/1995 | Sakiyama et al. ................. 708/319 |
| 5,519,626 | * | 5/1996 | Culbertson .......................... 716/8 |
| 5,765,010 | * | 6/1998 | Chung et al. ......................... 712/1 |
| 5,774,368 | * | 6/1998 | Chen et al. .......................... 716/8 |
| 5,870,308 | * | 2/1999 | Dangelo et al. ...................... 716/9 |
| 5,883,808 | * | 3/1999 | Kawarabayashi .................. 716/19 |
| 5,892,682 | * | 4/1999 | Hasley et al. ......................... 716/1 |
| 5,920,485 | * | 7/1999 | Mangelsdorf ........................ 717/5 |
| 5,926,396 | * | 6/1999 | Ohara .................................. 716/10 |

FOREIGN PATENT DOCUMENTS 01286033  11/1989  (JP) .
01286034  11/1989  (JP) .

OTHER PUBLICATIONS

J.P. Fishburn, et al., "TILOS: A Posynomial Programming Approach to Transistor Sizing", Proc. of IEEE, pp. 326–328, 1985.

Taiwanese Office Action dated Sep. 26, 2000.

* cited by examiner

Primary Examiner—Matthew Smith
Assistant Examiner—Jibreel Speight
(74) Attorney, Agent, or Firm—McDermott, Will & Emery

(57) ABSTRACT

The invention provides a functional module model for realizing optimal pipelining. The functional module model includes division line data representing division lines corresponding to positions where pipeline registers can be inserted and delay/area data representing the trade-off relationship between the delay and the area of each division area partitioned by the division lines. By using this functional module model, a pipeline register insertion position is selected among the division lines represented by the division line data, and the delay and the area of each division area are set on the basis of the trade-off relationship represented by the delay/area data. Thus, a pipelined circuit with a minimized area can be synthesized.

4 Claims, 14 Drawing Sheets

FUNCTIONAL MODULE MODEL, PIPELINED CIRCUIT SYNTHESIS AND PIPELINED CIRCUIT DEVICE

BACKGROUND OF THE INVENTION

The present invention relates to functional level design of an integrated circuit, and more particularly, it relates to pipelined circuit synthesis and a functional module model used in the synthesis.

A pipeline architecture is utilized for attaining a high speed operation of an electronic circuit. A method of pipelining a general circuit is described in detail in "Principles of Digital Design" (written by Gajski published by Prentice Hall).

In the pipelining, pipeline registers are inserted on signal paths, so that computation can be executed in parallel in respective areas partitioned by the pipeline registers.

FIGS. 14(a) and 14(b) are diagrams for illustrating the basic concept of the pipelining, wherein FIG. 14(a) is a given circuit diagram and FIG. 14(b) is a diagram resulting from the pipelining of the circuit of FIG. 14(a). In FIGS. 14(a) and 14(b), a reference numeral 310 denotes a symbol model of an operator (module) and a reference numeral 320 denotes a symbol model of a pipeline operator. In FIG. 14(a), positions where the pipeline registers can be inserted are positions 330 on signal paths between the operators 310 and 320 and a pipeline register insertion position 340 previously set in the pipeline operator 320.

In FIG. 14(b), four pipeline registers 350 are inserted in the circuit of FIG. 14(a). Respective data data(i) through data(i+6) are successively transferred through the areas partitioned by the pipeline registers 350 in every clock period. When the delays of the areas partitioned by the pipeline registers 350 are indicated as ds1, ds2 and ds3, respectively, the clock period of this circuit can be shortened to max(dsi), namely, the maximum value among the delays ds1, ds2 and ds3.

When the number of pipeline steps is indicated as N, the clock period can be ideally shortened to 1/N of the initial processing time. When the number of data is indicated as M, the data can be processed in a time period as short as (M+N−1)/N of the original processing time. When M is sufficiently larger than N, the pipelining can realize an operation speed of approximately N times as high as the original speed.

However, the pipeline register insertion positions are conventionally limited to signal paths between the operators and the previously set positions in pipeline operators. Accordingly, the delays of the respective areas partitioned by the pipeline registers cannot be equalized. It is when the delays of the respective areas partitioned by the pipeline registers are equal that the clock period can be shortened to 1/N of the original processing time. However, since the delays of the areas cannot be equalized by the conventional technique, the clock period cannot be sufficiently optimized.

Furthermore, the delay and the area of each module are fixed because the layout design has already been completed. Therefore, for example, when one area partitioned by the pipeline registers has a margin in its delay against the clock period, the setting of the delay and the area size of this area cannot be changed.

In this manner, optimal pipelining has not been realized by the conventional technique.

SUMMARY OF THE INVENTION

The present invention provides a functional module model for realizing optimal pipelining and pipelined circuit synthesis using the functional module model.

Specifically, the functional module model of this invention for representing a functional module used in functional level design of an integrated circuit comprises division line data representing a division line corresponding to a position where a pipeline register can be inserted.

Preferably, the functional module model further comprises delay/area data representing a trade-off relationship between a delay and an area of each division area partitioned by the division line.

Alternatively, the method of this invention of synthesizing a pipelined circuit in functional level design of an integrated circuit on the basis of connection information of functional modules, a functional module model including division line data representing a division line corresponding to a position where a pipeline register can be inserted being used, comprising a step of selecting, in a function module for which the functional module model is prepared, whether or not to insert a pipeline register at the position represented by the division line.

Preferably, in the method of synthesizing a pipelined circuit, the functional module model includes delay/area data representing a trade-off relationship between a delay and an area of each division area partitioned by the division line, and the method further comprises a step of setting, in a functional module for which the functional module model is prepared, a delay and an area of each division area on the basis of the trade-off relationship between the delay and the area represented by the delay/area data.

DETAILED DESCRIPTION OF THE INVENTION

Figure 1A:
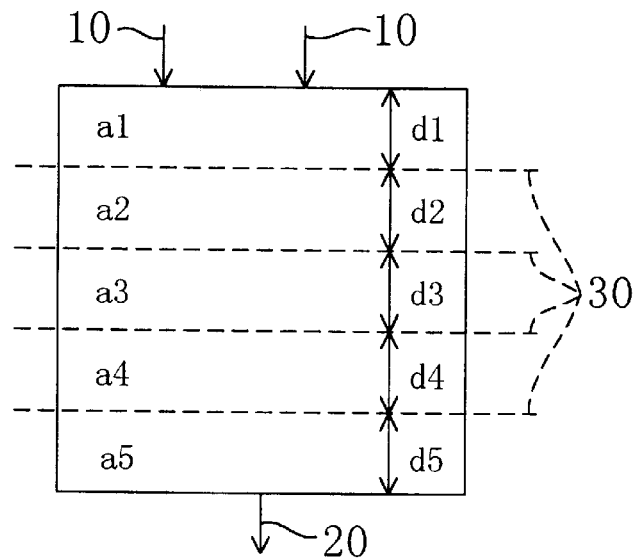
FIGS. 1(a) through 1(c) are conceptual diagrams of a functional module model according to the invention.
Figure 1B:
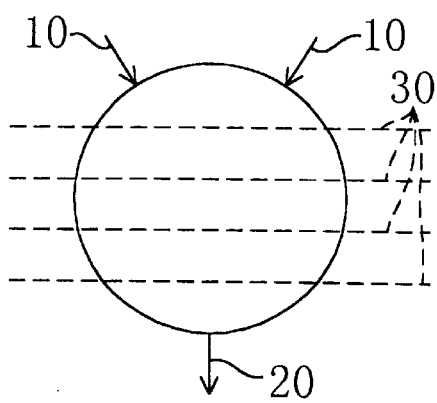

FIGS. 1(a) and 1(b) are conceptual diagrams for illustrating a functional module model according to an embodiment of the invention, wherein FIG. 1(a) shows the layout structure of a functional module and FIG. 1(b) shows a symbol standing for the functional module of FIG. 1(a) in a functional circuit diagram. In these drawings, a reference numeral 10 denotes an input signal, a reference numeral 20 denotes an output signal and a reference numeral 30 denotes a division line corresponding to a position where a pipeline resistor can be inserted. Furthermore, a1 through a5 respectively indicate the area sizes of division areas partitioned by the division lines 30, and d1 through d5 respectively indicate the delays of the division areas partitioned by the division lines 30, namely, time required for a signal to pass through the division areas.

The functional module of FIG. 1(a) includes one or more division lines 30 where a pipeline register can be inserted, and a pipeline register can be inserted in any position corresponding to the division lines 30. In each of the division areas partitioned by the division lines 30, there is a trade-off relationship between its area ai and its delay di (wherein i is 1 through 5). In other words, when a signal transfer speed is increased by improving a driving ability of a circuit in the division area, the delay can be decreased but the area is increased because the size of transistors included in the circuit is enlarged.

Figure 1C:
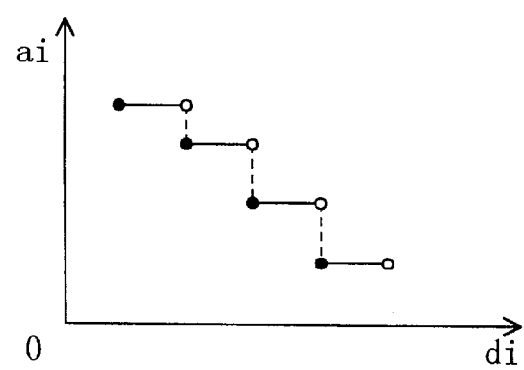

FIG. 1(c) is a graph for showing the trade-off relationship between the area ai and the delay di of the division area. For example, when a delay value is given to one division area, the minimum area feasible within the given delay is obtained on the basis of the relationship shown in FIG. 1(c). Alternatively, when an area value is given, the minimum delay feasible within the given area value is obtained on the basis of the relationship shown in FIG. 1(c).

Figure 2:
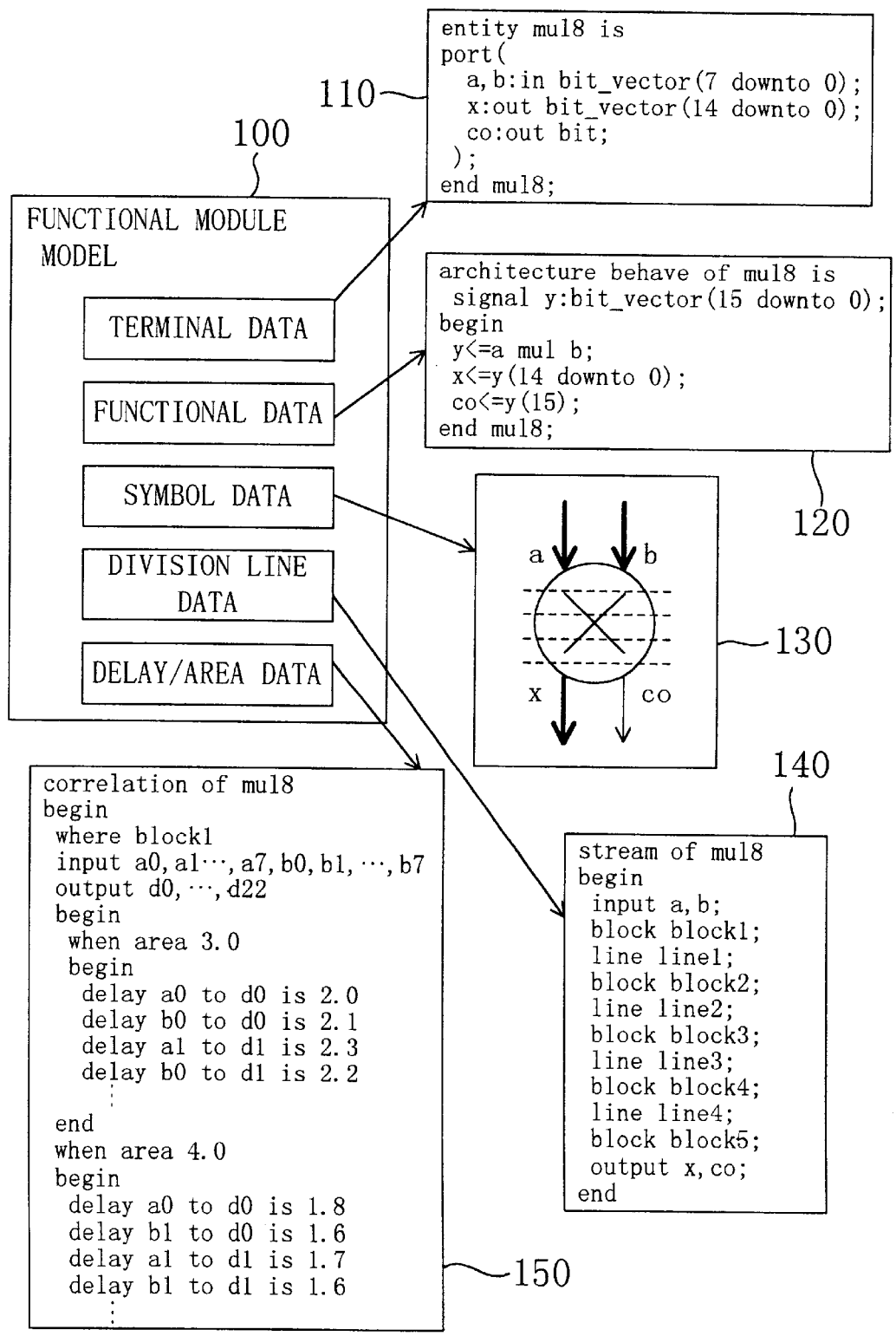
FIG. 2 is a diagram for showing an example of a representation on a computer of the functional module model of this invention.

FIG. 2 is a diagram for showing an exemplified representation on a computer of the functional module model of this embodiment. The functional module model 100 includes terminal data 110 representing information on external terminals, functional data 120 representing its internal operation, symbol data 130 representing symbols used in a functional circuit diagram, division line data 140 representing information on division lines, and delay/area data 150 representing the relationship between the delay and the area of each division area. The functional module model 100 shown in FIG. 2 corresponds to a multiplier.

As is shown in FIG. 2, the division line data 140 represent plural division lines line1 through line4 corresponding to positions where pipeline registers can be inserted. The circuit of this functional module can be partitioned by inserting a pipeline register in any of the division lines line1 through line4.

Figure 3:
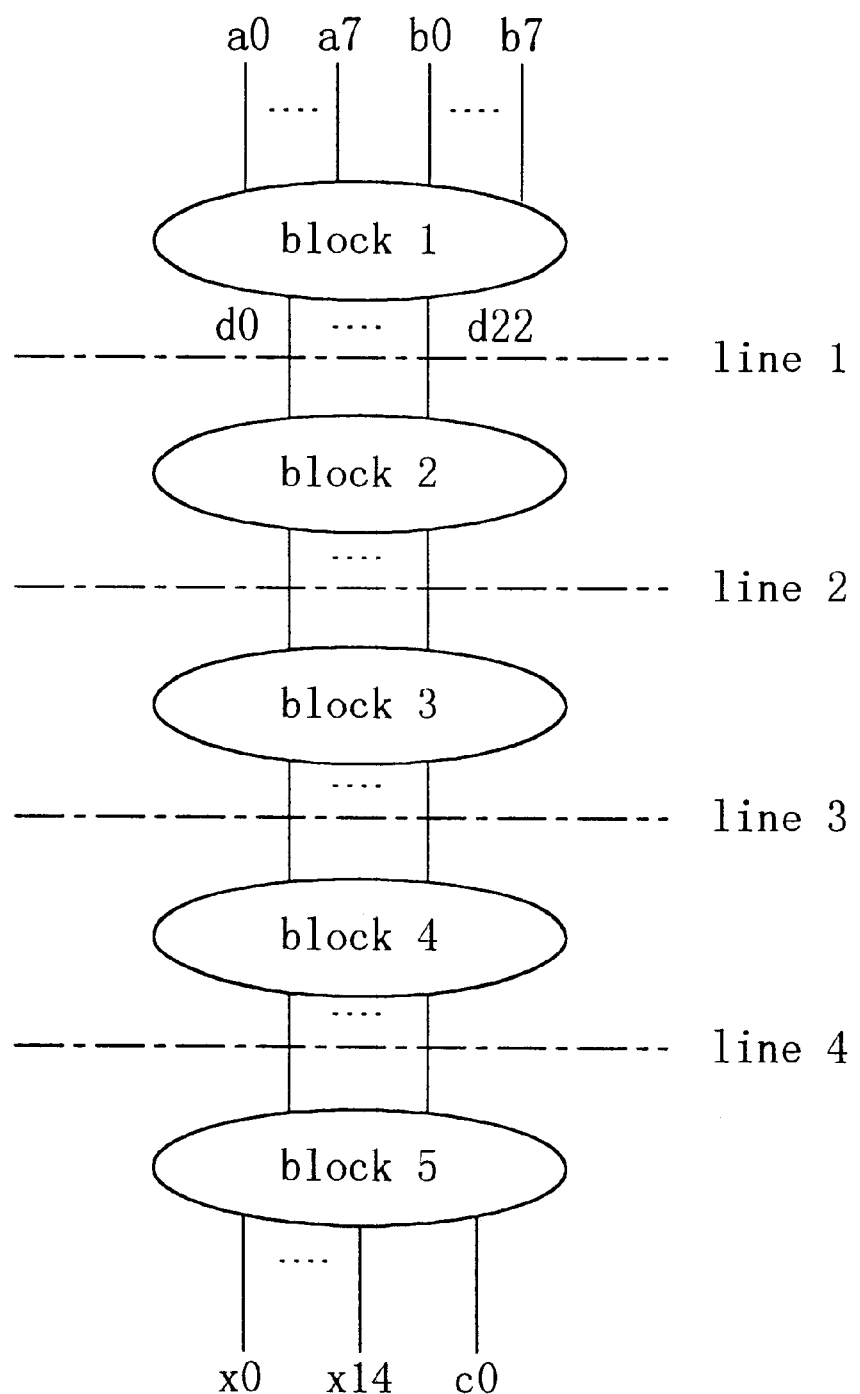
FIG. 3 is a schematic diagram of information on division lines represented by division line data of FIG. 2.

FIG. 3 is a schematic diagram for showing information on the division lines represented by the division line data 140 of FIG. 2. In FIG. 3, line1 through line4 indicate the division lines, block1 through block5 indicate the division areas partitioned by the division lines line1 through line4, a0 through a7 and b0 through b7 indicate input terminals of the functional module, x0 through x14 and co indicate output terminals of the functional module, and d0 through d22 indicate output terminals of the division area block1 (namely, input terminals of the division area block2).

Furthermore, as is shown in FIG. 2, the delay/area data 150 represents plural combinations of the delay and the area of each of the division areas block1 through block5, thereby representing the trade-off relationship between the area and the delay of each of the division areas block1 through block5. For example, the delay/area data 150 of FIG. 2 shows that, in the division area block1, the delay from the terminal a0 to the terminal d0 is 2.0 when the area is 3.0 and that the delay from the terminal b1 to the terminal d0 is 1.6 when the area is 4.0. Also in this embodiment, the delay of each division area is represented by the maximum delay among delays of respective paths in the division area, namely, the delay of a critical path. For example, the delay of the division area block1 is 2.3 when the area is 3.0 (wherein the critical path is a path from the terminal a1 to the terminal d1), and is 1.8 when the area is 4.0 (wherein the critical path is a path from the terminal a0 to the terminal d0). According to this embodiment, a solution which can attain more optimization of the area and the delay of each division area can be flexibly selected by preparing the delay/area data 150.

Figure 4:
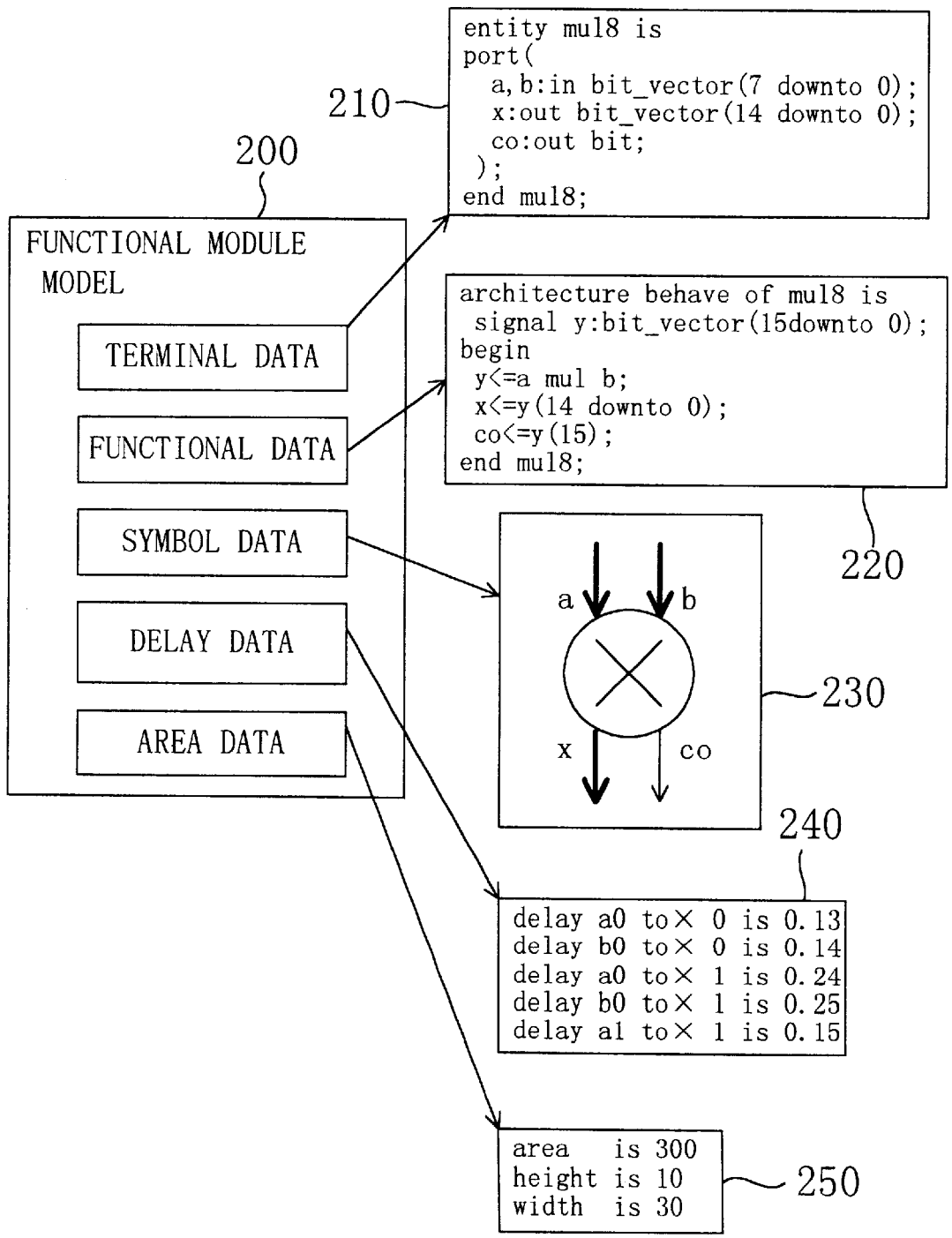
FIG. 4 is a diagram for showing a conventional functional module model.

FIG. 4 is a diagram for showing a conventional functional module model. As is shown in FIG. 4, the conventional functional module model 200 is not provided with division line data. Also, delay data 240 merely represents delays from the input terminals to the output terminals of this functional module, and the delays are fixed. Moreover, area data 250 merely represents area information on the entire functional module.

When the functional module model according to this embodiment is used, the pipeline register insertion positions can be optimized and the delay and the area of each partial circuit can be adjusted. As a result, the delay and the area of the entire pipelined circuit can be more appropriately optimized.

The functional module model of this embodiment will now be more specifically described by exemplifying an operator.

Figure 5:
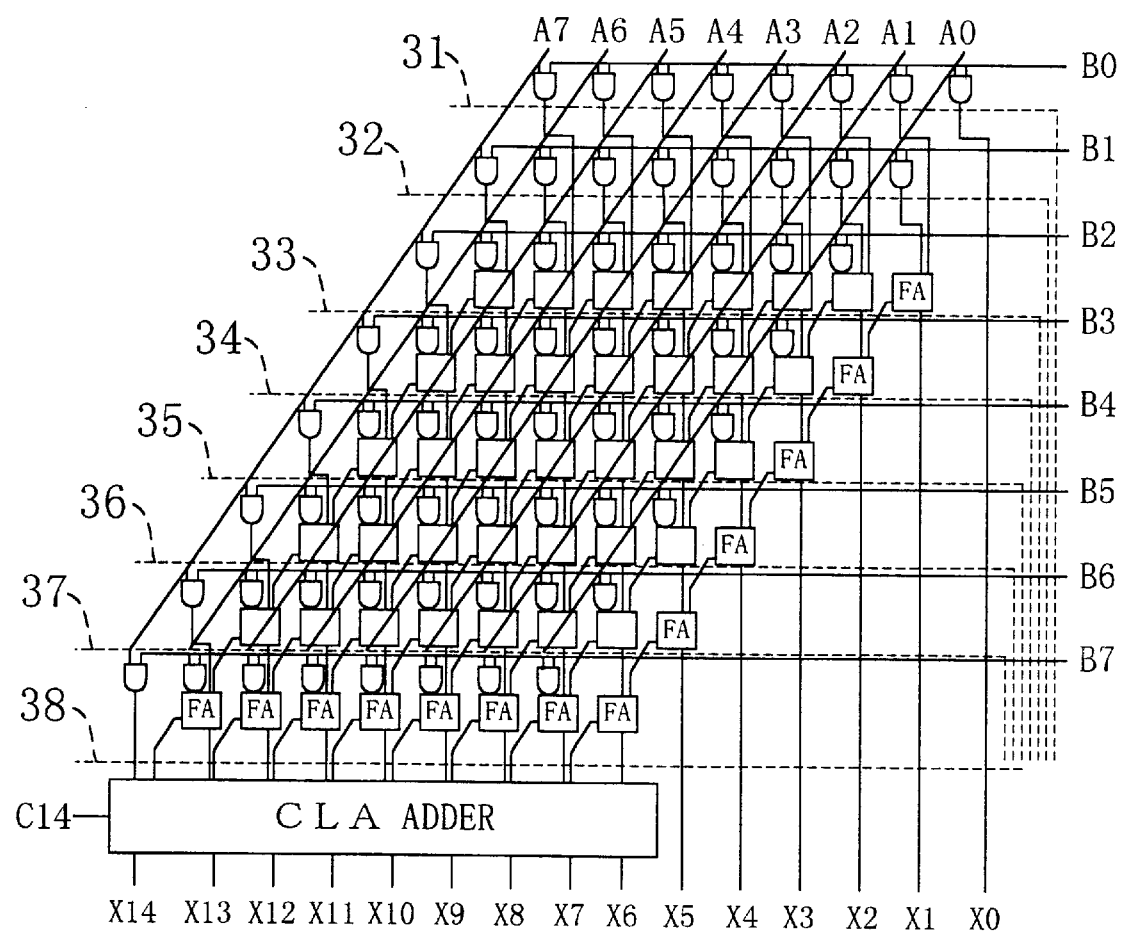
FIG. 5 is a circuit diagram of a carry lookahead type multiplier.

FIG. 5 is a circuit diagram of a carry lookahead type multiplier. The multiplier of FIG. 5 is an array multiplier in which plural full adders FA are arranged in an array. In FIG. 5, A0 through A7 indicate bit signal lines of an input A, B0 through B7 indicate bit signal lines of an input B, and X0 through X14 indicate bit signal lines of an output.

As the characteristics of the functional module model of this embodiment, (1) the positions where pipeline registers can be inserted, namely, division lines, are provided; and (2) the trade-off between the area and the speed can be analyzed by adjusting the driving ability of a circuit or the transistor size in each of division areas partitioned by the division lines.

When the multiplier of FIG. 5 is represented by using the functional module model of this embodiment, eight division lines 31 through 38 can be set. Each of partial circuits partitioned by the division lines 31 through 38 can be changed in its area by adjusting the transistor size therein. By adopting, for example, transistor size optimization disclosed in "TILOS: A Posynomial Programming Approach to Transistor Sizing" (Fishburn et al., ICCad85, pp. 326–328, 1985), the transistor size for minimizing the area can be calculated with a predetermined delay given. Accordingly, the trade-off relationship between the delay and the area as is shown in FIG. 1(c) can be obtained by adopting the transistor size optimization with the delay changed.

Figure 6:
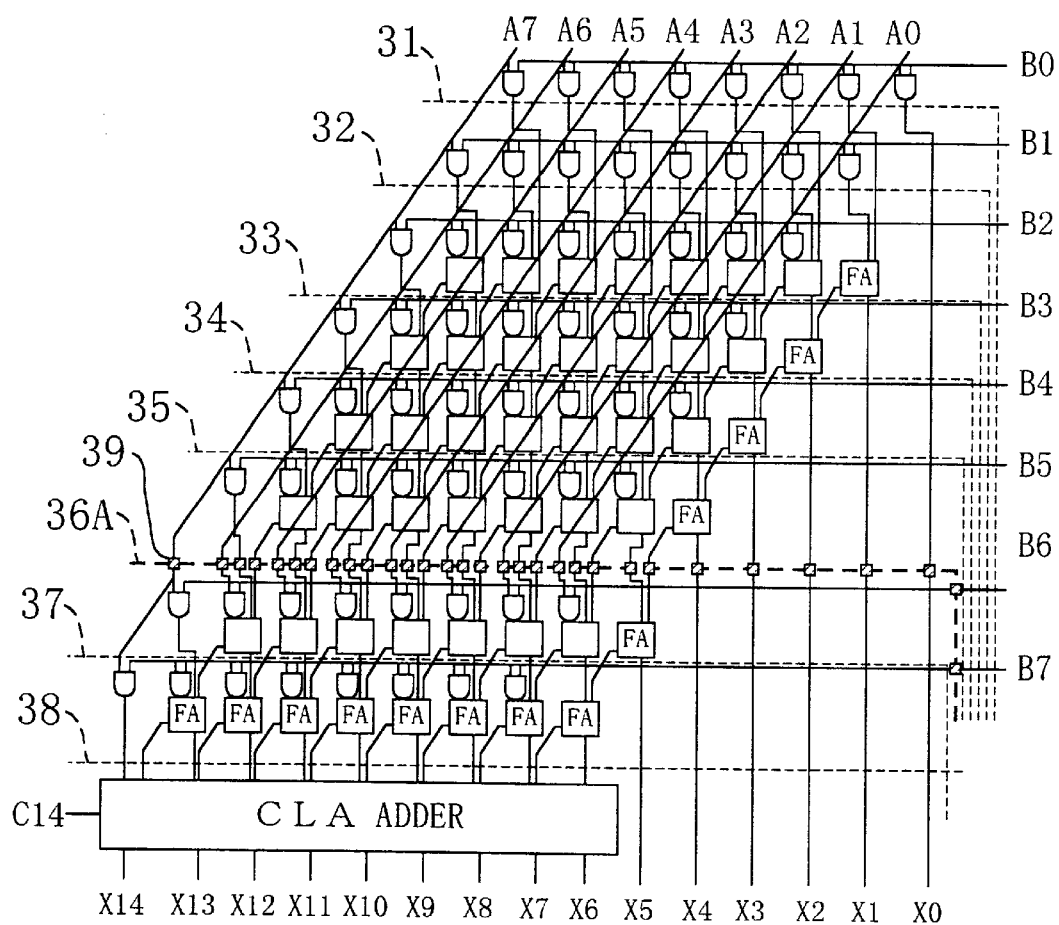
FIG. 6 is a circuit diagram obtained by inserting pipeline registers into the multiplier of FIG. 5.

FIG. 6 is a circuit diagram obtained by inserting pipeline registers into the multiplier of FIG. 5. As is shown in FIG. 6, the division line 36 is selected as a pipeline register insertion position 36A, and a pipeline register 39 is inserted at each intersection between the pipeline register insertion position 36A and the signal lines.

The functional module model of this embodiment is applicable also to any other operators such as a floating point operator, an adder and a divider. Also, the functional module model of this embodiment is applicable not only to an operator but also to a module such as a storage circuit and a combinational circuit.

Now, pipelined circuit synthesis by using the functional module model of this embodiment will be described.

The pipelined circuit synthesis of this embodiment can be defined as a problem, in a functional module for which the aforementioned functional module model is prepared, of selecting a pipeline register insertion position among division lines corresponding to positions where pipeline registers can be inserted and of setting the delay and the area of each division area partitioned by the division lines on the basis of the trade-off therebetween.

Figure 7:
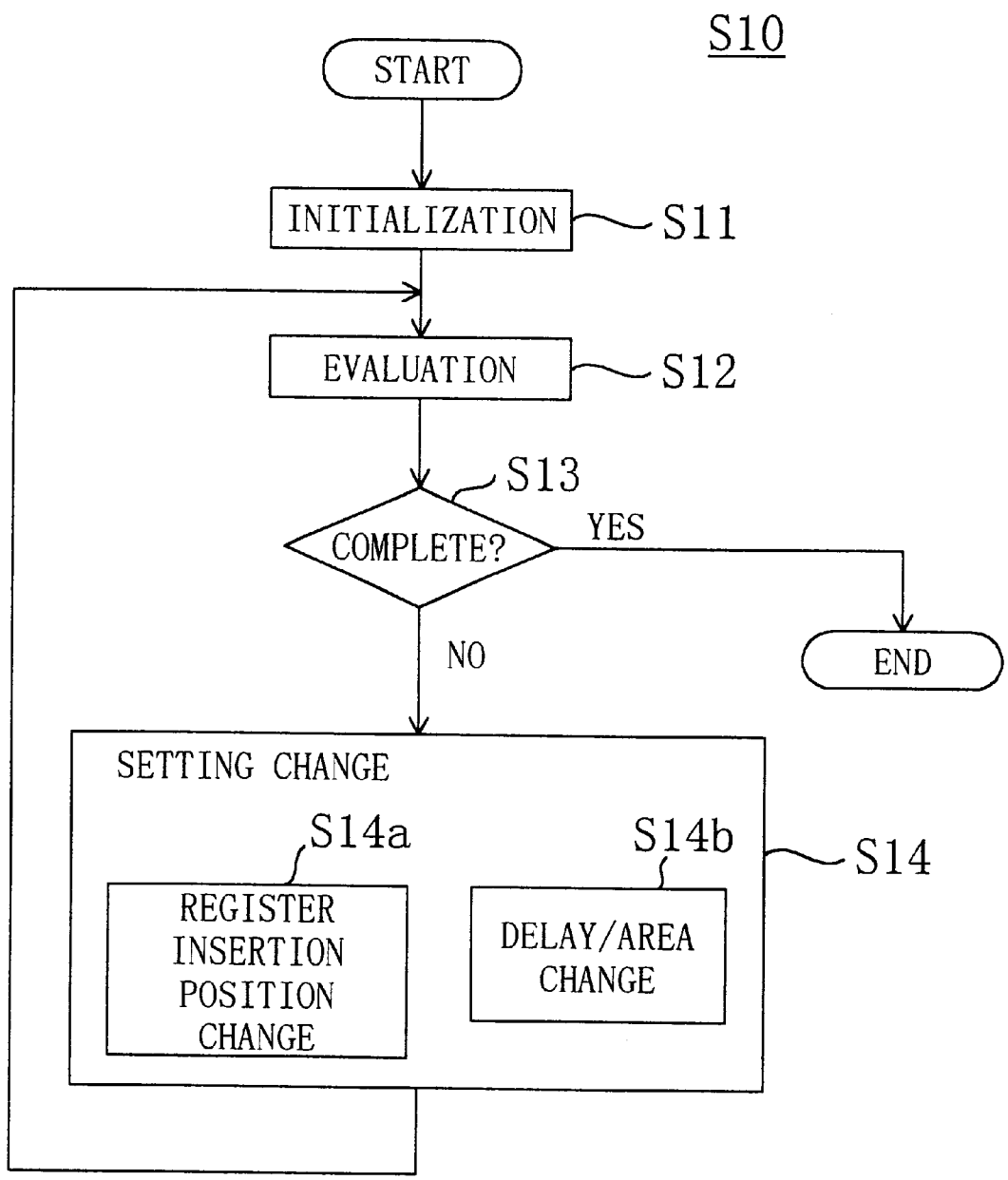
FIG. 7 is a flowchart for showing procedures in an example of pipelined circuit synthesis according to the invention.

Herein, for example, the following is defined as a problem in accordance with the design purpose: (Problem 1) To minimize the area of a pipelined circuit with the number of pipeline steps and a clock period given as conditions:

FIG. 7 is a flowchart for showing procedures in obtaining a solution of the problem 1 described as an example of the pipelined circuit synthesis of this embodiment. The procedures shown in FIG. 7 will now be described with reference to FIGS. 8(a) through 8(c) and 9.

Figure 8A:
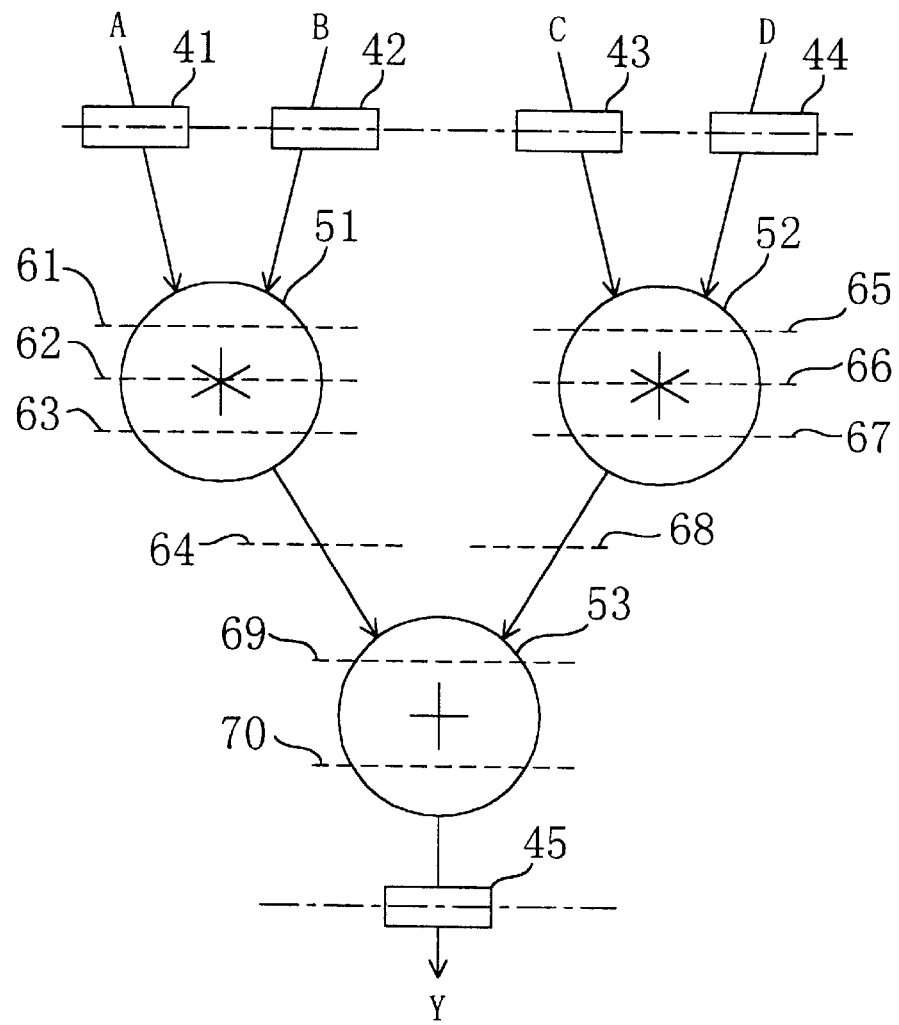
FIGS. 8(a) through 8(c) are diagrams for showing a pipelined circuit as a target of the pipelined circuit synthesis of this invention.
Figure 8B:
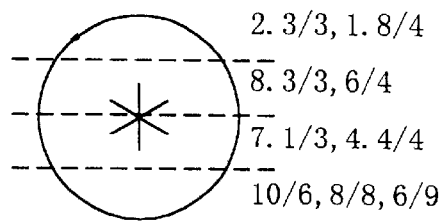
Figure 8C:
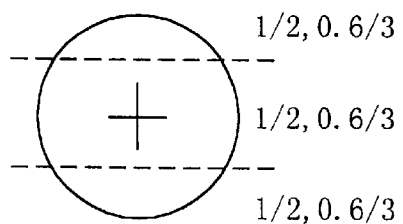

FIG. 8(a) shows a pipelined circuit as a target of the synthesis, represented by using connection between functional modules. In FIG. 8(a), reference numerals 41 through 45 denote registers, reference numerals 51 and 52 denote multipliers, and a reference numeral 53 denotes an adder. Specifically, FIG. 8(a) shows a circuit for outputting a sum of a product of inputs A and B and a product of inputs C and D as an output Y. FIG. 8(b) shows a functional module model of a multiplier, and FIG. 8(c) shows a functional module model of an adder. In FIGS. 8(b) and 8(c), each broken line indicates a division line, and a numeral shown in each division area partitioned by the division lines indicates a relationship between the delay and the area size of the division area. A numeral preceding "/" indicates the delay and a numeral following "/" indicates the area. For example, "2.3/3" means the division area has an area of 3 when the delay is 2.3.

Figure 13:
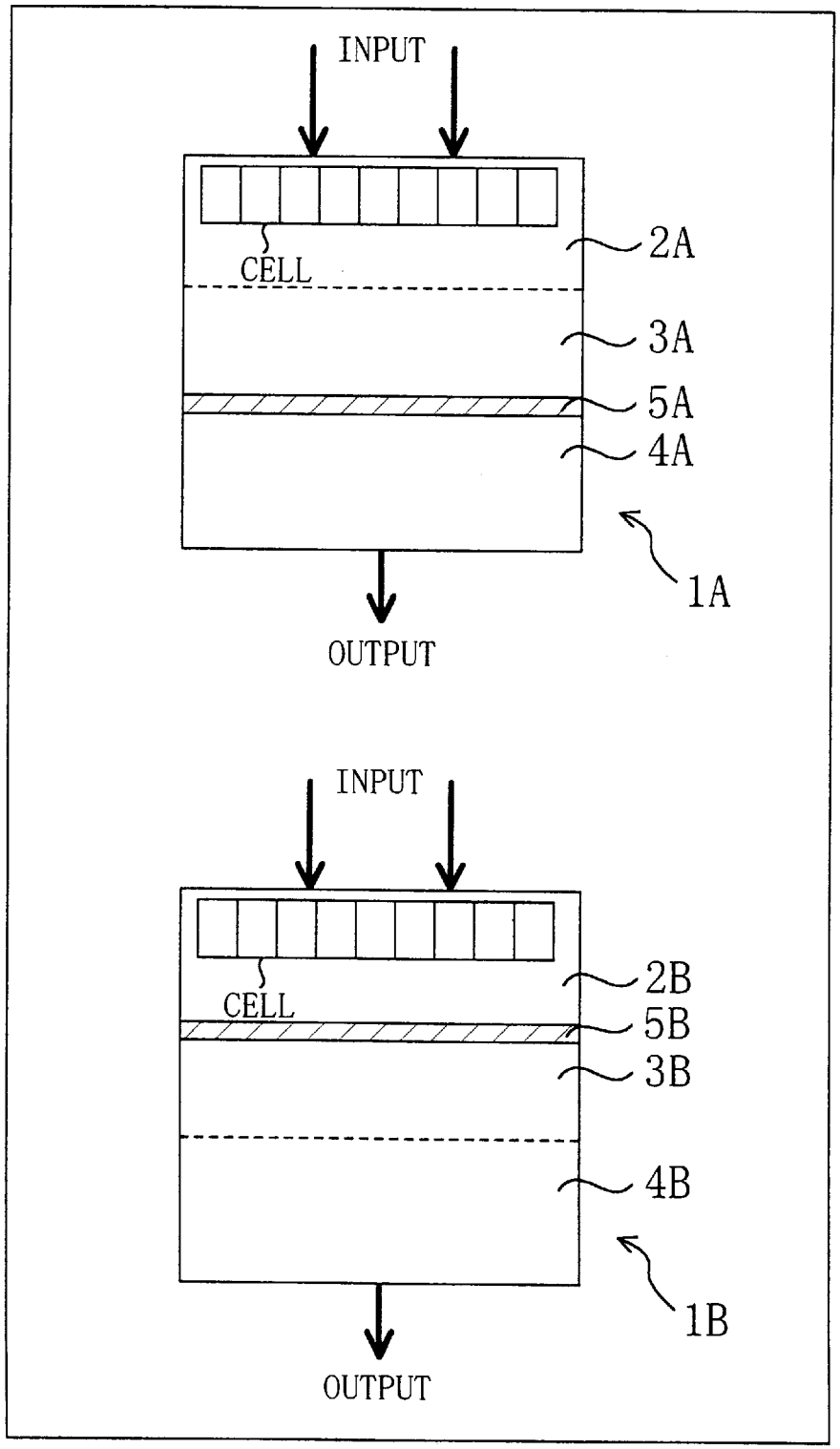
FIG. 13 is a schematic diagram of a layout of a pipelined circuit device designed by the pipelined circuit synthesis of the invention.
Figure 14A:
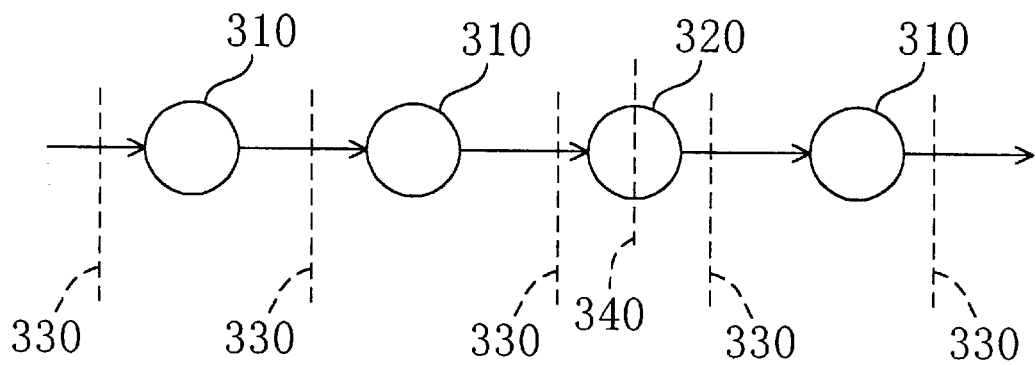
FIGS. 14(a) and 14(b) are diagrams for illustrating the basic concept of pipelining.
Figure 14B:
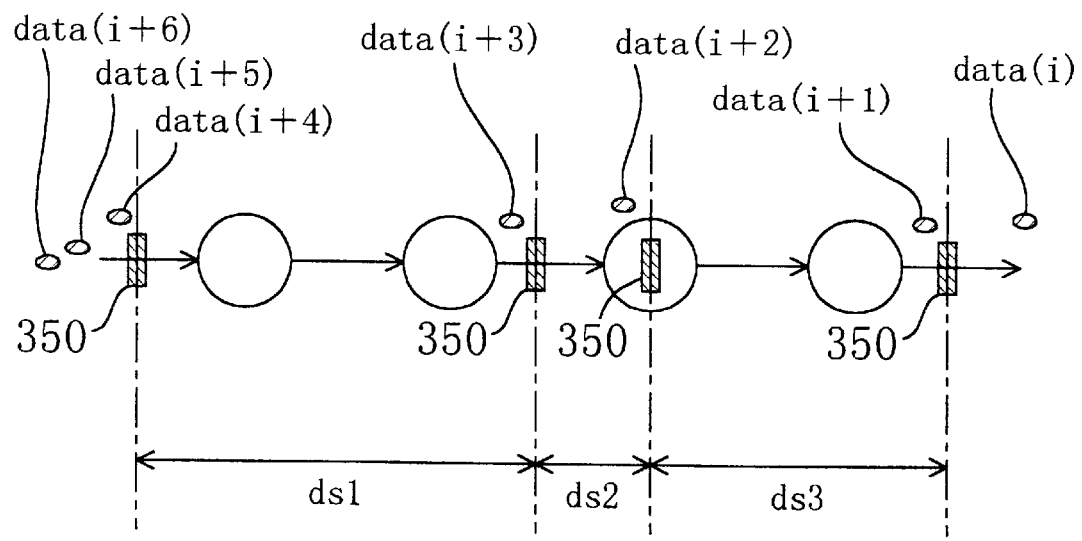

With regard to the pipelined circuit of FIG. 8(a), 2 and 13.0 are given as the conditions of the number of pipeline steps and the clock period, respectively. Specifically, by inserting pipeline registers, a portion between the registers 41 through 44 and the register 45 is to be divided into two steps, the delay between the registers is to be suppressed to 13.0 or less and the circuit area is to be minimized.

First, in a step S11 the pipeline register insertion positions, and the delay and the area of each division area are initialized. In this case, a division line 61 of the multiplier 51 and a division line 65 of the multiplier 52 are selected as the pipeline register insertion positions. Also, the delay and the area of each division area are selected so as to minimize the delay. Specifically, with regard to the multipliers 51 and 52, 1.8/4, 6/4, 4.4/4 and 6/9 shown in FIG. 8(b) are selected as the delays and the areas in the descending order, and with regard to the adder 53, 0.6/3, 0.6/3 and 0.6/3 shown in FIG. 8(c) are selected as the delays and the areas in the descending order.

Next, in a step S12, the pipeline register insertion positions, and the delay and the area of each division area set as described above are evaluated. The delays from the registers 41 and 42 to the division line 61 and from the registers 43 and 44 to the division line 65 are all 1.8, but the delays from the division line 61 to the register 45 and from the division line 65 to the register 45 are both 18.2 (=6+4.4+6+0.6+0.6+0.6), and hence largely exceed the given clock period, 13.0. Furthermore, at this point, the areas of the multipliers 51 and 52 are both 21 (=4+4+4+9) and the area of the adder 53 is 9 (=3+3+3), and hence the total area is 51.

Then, in a step S14, the pipeline register insertion positions are changed (step S14a) or the delay and the area of each division area are changed (step S14b). In this case, the setting of the pipeline register insertion positions is changed to a division line 62 of the multiplier 51 and a division line 66 of the multiplier 52. Then, the changed setting is evaluated in the step S12. As a result of the change, the delays from the registers 41 and 42 to the division line 62 and from the registers 43 and 44 to the division line 66 are all 7.8 (=1.8+6), and the delays from the division line 62 to the register 45 and from the division line 66 to the register 45 are both 12.2 (=4.4+6+0.6+0.6+0.6). Thus, all the delays can be suppressed to be smaller than the given clock period, 13.0.

The processing is still continued for the purpose of further decreasing the total area. In the step S14, for example, the setting of the delay and the area of the first division area of the multiplier 51 is changed from 1.8/4 to 2.3/3. As a result of the evaluation in the step S12, the delays from the registers 41 and 42 to the division line 62 are increased to 8.3 (=2.3+6), but the area of the multiplier 51 is decreased to 20 (=3+4+4+9), resulting in decreasing the total area to 50.

Such procedures in the steps S14 and S12 are repeatedly carried out until a completing condition of a step S13 is satisfied. As the completing condition of the step S13, the number of times of repeating the steps S14 and S12 can be adopted, or the number of times that the evaluation of the step S12 is not improved continuously can be adopted.

Figure 9:
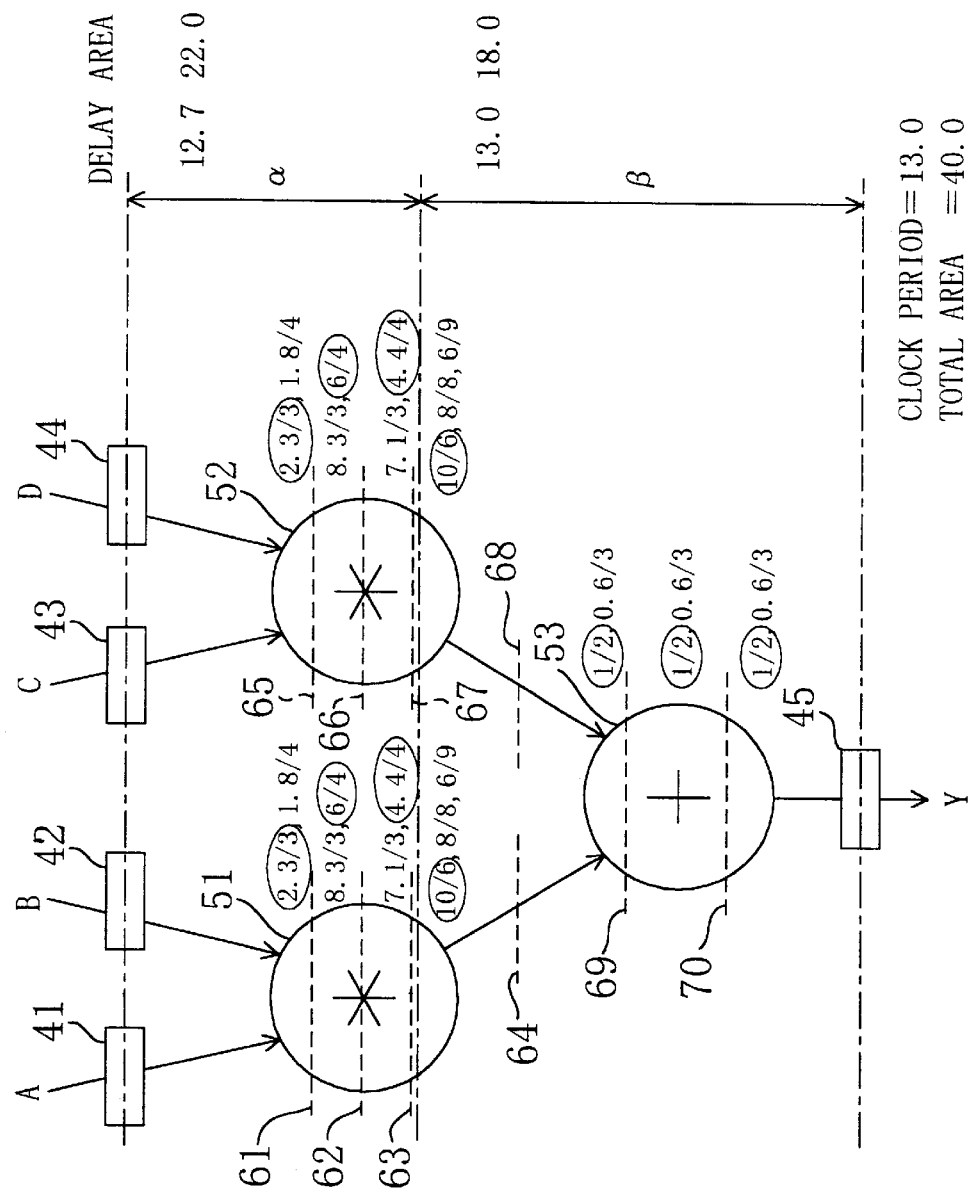
FIG. 9 is a diagram for showing the result of the procedures of FIG. 7 performed on the pipelined circuit of FIG. 8(a)

FIG. 9 is a diagram for showing the result obtained through the procedures of FIG. 7 on the pipelined circuit of FIG. 8(a). As is shown in FIG. 9, a division line 63 of the multiplier 51 and a division line 67 of the multiplier 52 (shown with a dashed line in FIG. 9) are ultimately selected as the pipeline register insertion positions. As the delay and the area of each division area, with regard to the multipliers 51 and 52, 2.3/3, 6/4, 4.4/4 and 10/6 are ultimately selected in the descending order, and with regard to the adder 53, 1/2,1/2 and 1/2 are ultimately selected in the descending order. As a result, a first step region α has the delay of 12.7 and the area of 22.0, and a second step region β has the delay of 13.0 and the area of 18.0. Thus, a solution for making the circuit operable at the clock period of 13.0 with the total area of 40.0 can be obtained.

Figure 10:
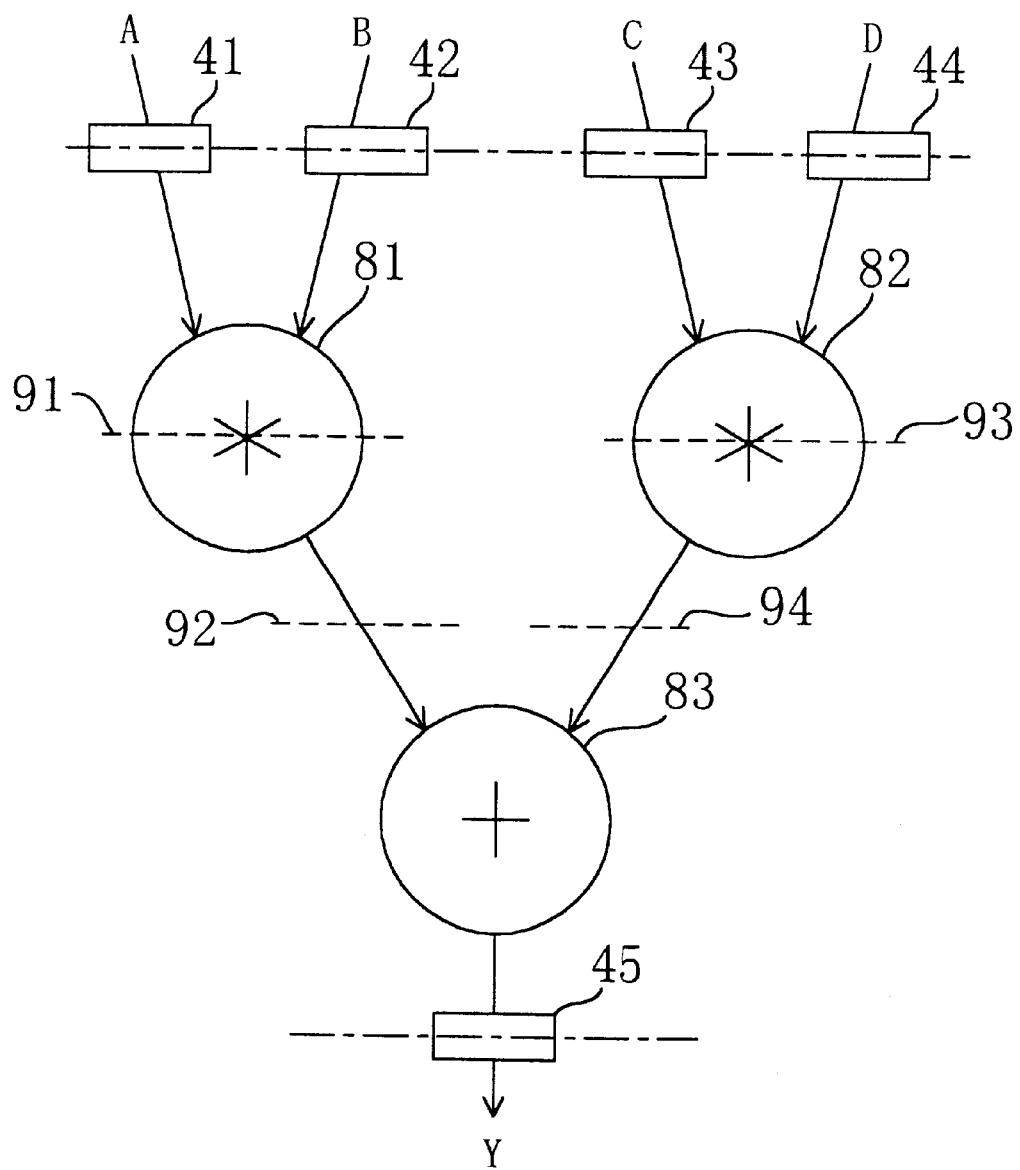
FIG. 10 is a pipelined circuit using a conventional functional module model.

FIG. 10 shows a pipelined circuit represented by using the conventional functional module models, and is a diagram of a circuit for outputting a sum of a product of inputs A and B and a product of inputs C and D as an output Y similarly to the circuit of FIG. 8(a).

In the conventional functional module models, the pipeline register insertion positions are limited to signal paths between the modules and a register insertion position of a module having a functional module model in which the register insertion position is set. For example, when a functional module model in which a register insertion position is set is available for multipliers 81 and 82, the positions where pipeline registers can be inserted are limited to four, namely, register insertion positions 91 and 93 of the multipliers 81 and 82 and pipeline register insertion positions 92 and 94 between the multipliers 81 and 82 and an adder 83.

In other words, the degree of freedom in the pipeline register insertion position is so low that the delays of division areas partitioned by the pipeline registers cannot be sufficiently equalized, and hence, the clock period cannot be sufficiently shortened. Furthermore, since the delay and the area of each module are fixed, the area cannot be decreased even when the delay of one division area partitioned by the pipeline registers has a margin against the clock period.

In contrast, according to this embodiment, the insertion positions where pipeline registers can be inserted are as many as 9 in, for example, the circuit of FIG. 8(a), and hence, the optimization can be more minutely. In other words, since the degree of the freedom in the pipeline register insertion position is increased, the delays of the respective division areas partitioned by the pipeline registers can be sufficiently equalized, resulting in sufficiently shortening the clock period. Furthermore, since the delay and the area can be traded off in each division area, the area can be decreased in a division area having a margin in the delay against the clock period. As a result, the total area of the circuit can be minimized.

In the procedures shown in FIG. 7, the pipeline register insertion positions and the delay and the area of each division area can be evaluated by using, for example, a cost function Cost as follows:

$$Cost = A*\Sigma ai + B*max(dsi) + C*p$$

wherein ai indicates the area of each division area partitioned by the division lines, $\Sigma ai$ indicates a sum of the areas of modules, dsi indicates the delay of each division area partitioned by the pipeline registers, and max(dsi) indicates the maximum delay among the delays of respective division areas, namely, a feasible clock period. Also, p indicates a value for setting whether or not the feasible clock period is larger than the given clock period, which is set at 1 when the feasible clock period is larger and at 0 when not. Furthermore, A, B and C are parameters for weighting respective terms and are set so as to satisfy a relationship of C>>B>>A>0.

Through sequential improvement by repeating the step S14, the cost function Cost is minimized. In the step S14, either the step S14a or the step S14b is selected by using random numbers. When the step S14a is selected, a division line adjacent to the division line currently selected as the pipeline register insertion position is selected as a new pipeline register insertion position. When the step S14b is selected, an arbitrary division area is selected by using the random numbers, and the delay and the area of the selected division area are changed to adjacent ones.

In stead of the sequential improvement, simulated annealing can be adopted.

In this manner, according to the pipelined circuit synthesis shown in FIG. 7, since the pipeline register insertion positions are selected as well as the delay and the area of each division area are optimized, the pipelined circuit can be synthesized so as to attain the minimum area while satisfying the given conditions of the clock period and the number of pipeline steps.

Moreover, the following can be defined as another problem in accordance with the design purpose. (Problem 2) To obtain feasible plural numbers of pipeline steps with a clock period given as a condition, so as to minimize the area of each pipeline step in a pipelined circuit. In this case, plural executable solutions can be obtained.

Figure 11:
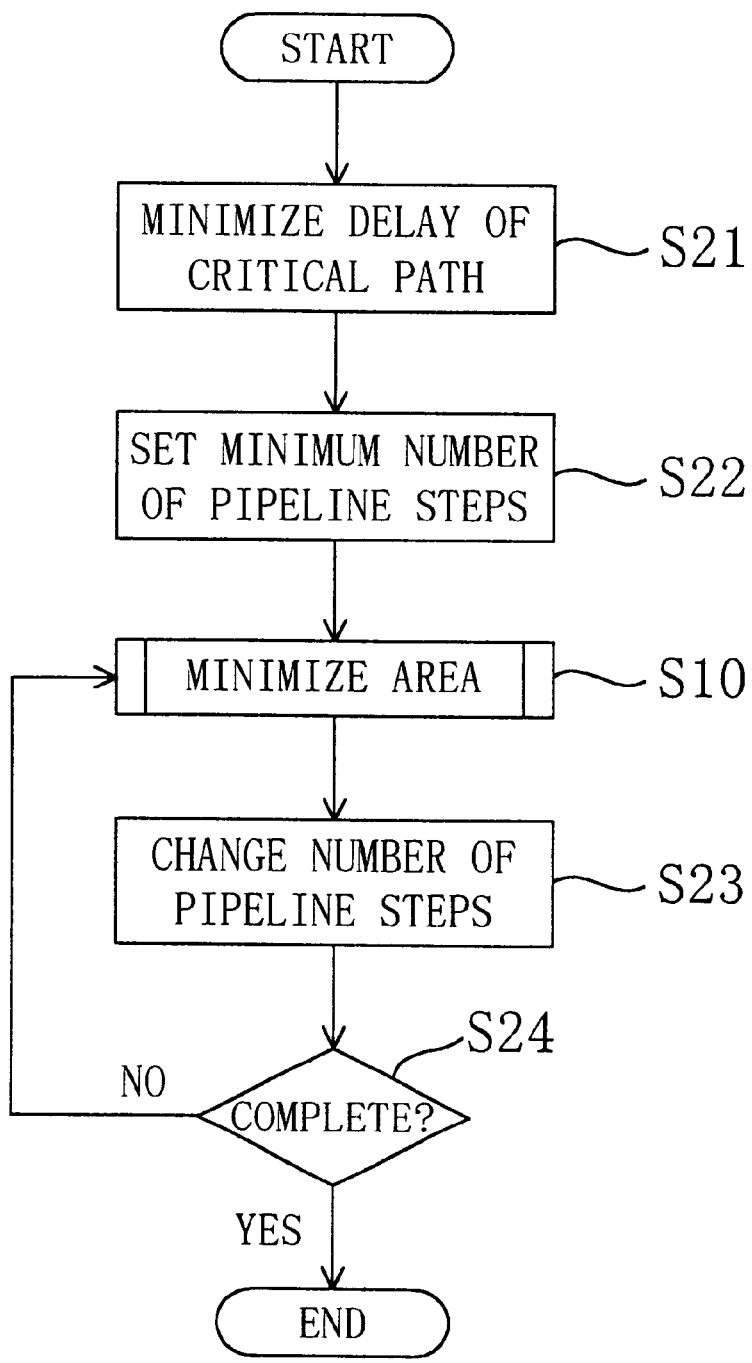
FIG. 11 is a flowchart for showing procedures in another example of the pipelined circuit synthesis of the invention.

FIG. 11 is a flowchart for showing procedures for obtain the solutions of this problem described another example of the pipelined circuit synthesis according to this embodiment.

In a step S21, a critical path of a pipelined circuit as a target of the synthesis is obtained. Then, with regard to each module on the critical path, values of the minimum delay and the area attained by the minimum delay are selected on the basis of the trade-off relationship between the delay and the area.

In a step S22, a pipeline register is inserted in the critical path, so that the delay of each division area partitioned by the pipeline register can be smaller than the given clock period. At this point, the number of pipeline steps is made as small as possible. The number of the pipeline steps thus attained is set as a minimum number of pipeline steps.

In a step S10, the procedures shown in FIG. 7 are carried out. Specifically, the pipeline register insertion positions, and the delay and the area of each division area are determined so that the pipelined circuit as the target of the synthesis can be operated with the minimum number of pipeline steps set in the step S22 at the given clock period with its area minimized.

In a step S23, the number of pipeline steps is increased by one. Then, the procedure in the step S10 is performed by using the number of pipeline steps set in the step S23. Specifically, the pipeline register insertion positions, and the delay and the area of each division area are determined so that the pipelined circuit as the target of the synthesis can be operated with the number of pipeline steps set in the step S23 at the given clock period with its area minimized.

The procedures in the step S23 and the step S10 are repeatedly carried out until a completing condition of a step S24 is satisfied. In the step S24, the procedure can be completed, for example, when it is determined from the result of the step S10 that the minimum area of the pipelined circuit cannot be made smaller by increasing the number of pipeline steps.

In this manner, when the pipelined circuit synthesis of FIG. 11 is adopted, the optimal number of pipeline steps can be determined while selecting the pipeline register insertion positions and optimizing the delay and the area of each division area. Accordingly, the pipelined circuit can be synthesized at a high speed with its area minimized.

It is possible to optimize the pipelined circuit by merely changing the pipeline register insertion positions without changing the delay and the area of each division area. In this case, for example, similar procedures to those of FIG. 7 can be performed, and in the step S14, the step S14a alone is selectable, namely, the pipeline register insertion positions alone are changed.

Figure 12:
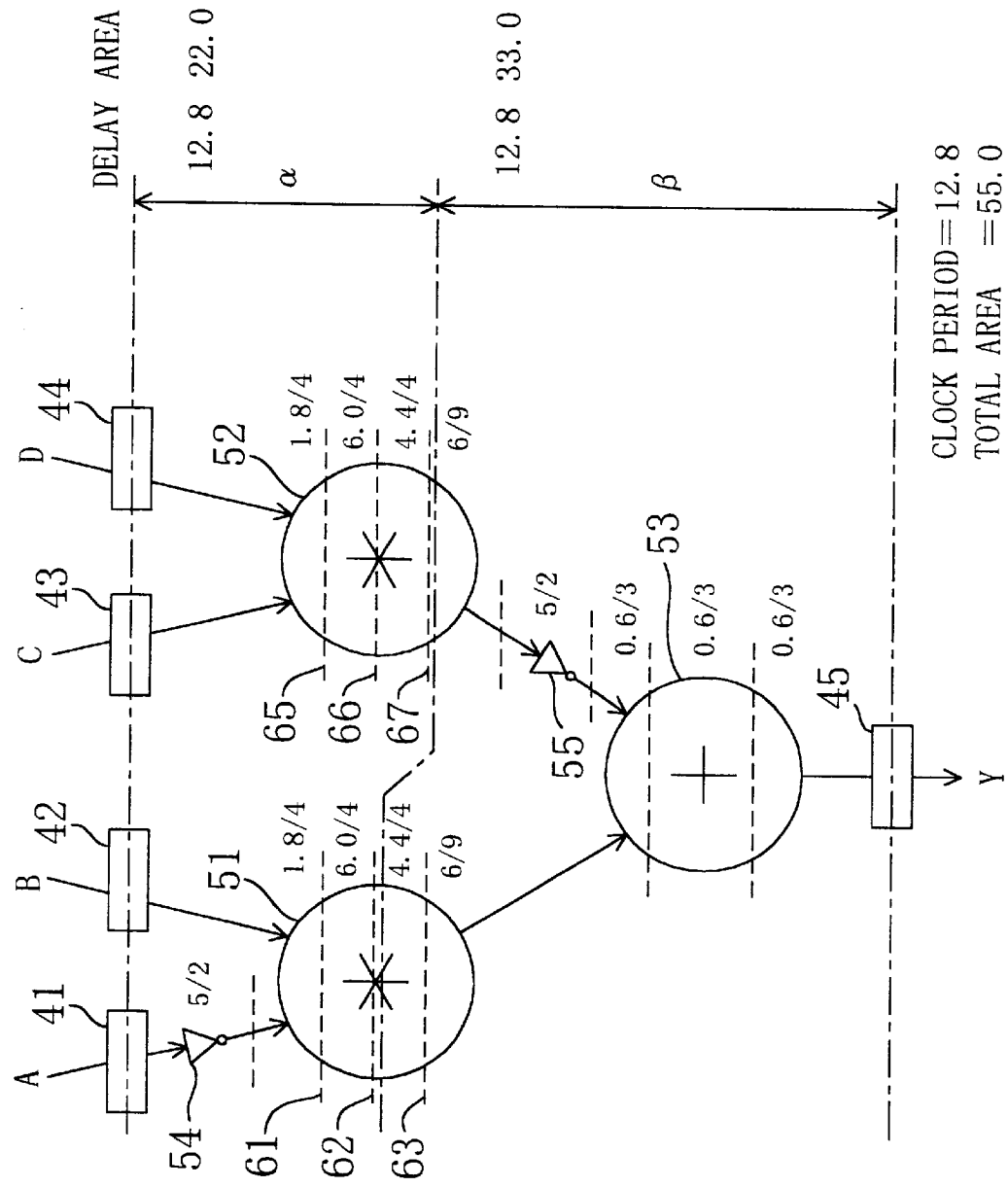
FIG. 12 is a diagram for showing the result of optimization of a pipelined circuit by merely changing pipeline register insertion positions.

FIG. 12 is a diagram for showing a result of optimization of a pipelined circuit by merely changing the pipeline register insertion positions. In FIG. 12, an inverter 54 is inserted between the register 41 and the multiplier 51 and an inverter 55 is inserted between the multiplier 52 and the adder 53 of the pipelined circuit of FIG. 8(a). As a result of the optimization, the division line 62 of the multiplier 51 and the division line 67 of the multiplier 52 are selected as the pipeline register insertion positions, thereby realizing the clock period of 12.8.

If the pipeline insertion positions are fixed in the multipliers 51 and 52, the delays of both the first step region α and the second step region β cannot be 12.8. For example, when the pipeline register insertion positions are fixed to the second division lines 62 and 66 in the multipliers 51 and 52, the delay of the second step region β is 17.2. On the other hand, when the pipeline register insertion positions are fixed to the third division lines 63 and 67 in the multipliers 51 and 52, the delay of the first step region α is 17.2.

In this manner, the pipelined circuit can be optimized by changing the pipeline register insertion positions alone. In this case, the functional module model can include merely the division line data representing the division lines, and the delay/area data representing the trade-off between the delays and the areas of the division areas are not necessary.

Also, the functional module model of this embodiment can be used for the optimization of a pipelined circuit as far as it includes the delay/area data representing the trade-off between the delay and the area of each division area partitioned by the pipeline register insertion positions even when it does not include the division line data and the pipeline register insertion positions are previously fixed. In this case, similar procedures to those of FIG. 7 can be performed, and in the step S14, the step S14b alone is selectable, namely, the delay and the area alone are changed.

FIG. 13 is a schematic diagram for showing a layout of a pipelined circuit designed by the pipelined circuit synthesis according to this embodiment. In FIG. 13, reference numerals 1A and 1B denote blocks having the same function, and the block 1A includes partial circuits 2A, 3A and 4A, and the block 1B includes partial circuits 2B, 3B and 4B. The partial circuit 2A corresponds to the partial circuit 2B, the partial circuit 3A corresponds to the partial circuit 3B and the partial circuit 4A corresponds to the partial circuit 4B, and each pair of these respective corresponding circuits has the same function. However, while a pipeline register 5A is provided between the partial circuit 3A and the partial circuit 4A in the block 1A, a pipeline register 5B is provided between the partial circuit 2B and the partial circuit 3B in the block 1B.

In a conventional pipelined circuit device, when plural blocks have the same function, pipeline registers are inserted in the same positions in the respective blocks. In contrast, in the pipelined circuit device of this embodiment, the pipeline register insertion positions can be different in the blocks having the same function as is shown in FIG. 13. Also, in the pipelined circuit device of this embodiment, the corresponding partial circuits can be in different sizes in the blocks having the same function. In such a circuit device, if the pipeline registers are inserted in the same positions in the respective blocks, or if the corresponding partial circuits have the same size, it is feared that the circuit device cannot be normally operated. This is because a delay between the pipeline registers can be changed and a timing error can be caused when the changed delay exceeds the clock period.

What is claimed is:

1. A method of synthesizing a pipelined circuit in functional level design of an integrated circuit on the basis of connection information of functional modules, comprising the steps of:

preparing a functional module model for representing a functional module, said functional module model including, division line data representing a plurality of division lines each corresponding to a position where a pipeline register can be inserted, and delay/area data representing a trade-off relationship between a delay and an area of each of division areas partitioned by said division lines;

selecting, in said functional module, one of said division lines, which represents a position to insert a pipeline register; and setting, in said functional module, a delay and an area of each division area on the basis of said trade-off relationship between the delay and the area represented by said delay/area data.

2. The method of synthesizing a pipelined circuit of claim 1, wherein a number of pipeline steps and a clock period are given as conditions, and said method further comprises a step of determining the pipeline register insertion position and the delay and the area of each division area by performing said selecting and setting steps so that said pipelined circuit is operable with said given number of pipeline steps at said given clock period and has a minimized area.

3. The method of synthesizing a pipelined circuit of claim 1, wherein a clock period is given as a condition, and said method further comprises steps of:

obtaining a minimum number of pipeline steps attained when said pipelined circuit is operated at said given clock period; and determining the pipeline register insertion position and the delay and the area of each division area by performing said selecting and setting steps so that said pipelined circuit is operable with said minimum number of pipeline steps at said given clock period and has a minimum area.

4. The method of synthesizing a pipelined circuit of claim 3, further comprising the steps of:

setting a number of pipeline steps at an increased number from said minimum number of pipeline steps, and determining the pipeline register insertion position and the delay and the area of each division area by performing said selecting and setting steps so that said pipelined circuit is operable with said set number of pipeline steps at said given clock period and has a minimum area.

* * * * *